(12) United States Patent
Hsieh et al.

(10) Patent No.: US 11,594,647 B2
(45) Date of Patent: Feb. 28, 2023

(54) LIGHT-CONCENTRATING STRUCTURE WITH PHOTOSENSITIVITY ENHANCING EFFECT

(71) Applicant: NATIONAL APPLIED RESEARCH LABORATORIES, Taipei (TW)

(72) Inventors: Yuan-Ta Hsieh, Tainan (TW); Chia-Hsin Lee, Tainan (TW); Hann-Huei Tsai, Tainan (TW); Ying-Zong Juang, Hsinchu (TW); Jian Li, Tainan (TW); Bo-You Liu, Tainan (TW)

(73) Assignee: National Applied Research Laboratories, Taipei (TW)

( * ) Notice: Subject to any disclaimer, the term of this patent is extended or adjusted under 35 U.S.C. 154(b) by 31 days.

(21) Appl. No.: 17/236,204

(22) Filed: Apr. 21, 2021

(65) Prior Publication Data

US 2022/0344522 A1    Oct. 27, 2022

(51) Int. Cl.
*H01L 31/0216* (2014.01)
*H01L 31/103* (2006.01)

(52) U.S. Cl.
CPC ...... *H01L 31/02161* (2013.01); *H01L 31/103* (2013.01)

(58) Field of Classification Search
CPC .................................................. H01L 31/02161
See application file for complete search history.

(56) References Cited

U.S. PATENT DOCUMENTS

| 2019/0252442 A1* | 8/2019 | Tanaka .............. H01L 27/14623 |
| 2020/0006410 A1 | 1/2020 | Wu et al. |
| 2020/0135940 A1* | 4/2020 | Le-Briz ............... H01L 27/1443 |

FOREIGN PATENT DOCUMENTS

| CN | 102637704 A | * | 8/2012 | ....... H01L 27/14623 |
| CN | 102637704 A | | 8/2012 | |
| CN | 102881700 A | | 1/2013 | |
| CN | 103199099 A | | 7/2013 | |
| CN | 106531753 A | | 3/2017 | |

OTHER PUBLICATIONS

Gambino et al. "CMOS Imager with Copper Wiring and Lightpipe", 2006 International Electron Devices Meeting, Dec. 11-13, 2006 (Year: 2006).*
Search Report dated Aug. 2, 2021 for corresponding TW Application No. 110102537.

* cited by examiner

*Primary Examiner* — Sitaramarao S Yechuri
(74) *Attorney, Agent, or Firm* — Rosenberg, Klein & Lee (57) ABSTRACT

This invention provides a light-concentrating structure with photosensitivity enhancing effect, including the substrate, buried layer, first electrode layer, second electrode layer, dielectric layer and interconnection structure. The substrate is equipped with a housing space; the buried layer is arranged above the substrate with the housing space; the first electrode layer is arranged above the buried layer; the second electrode layer is arranged in the middle of the first electrode layer; the dielectric layer is arranged above the second electrode layer; the interconnection structure is arranged above the substrate and the first electrode layer surrounding the dielectric layer, which forms an opening and a light-concentrating recess groove.

6 Claims, 6 Drawing Sheets

LIGHT-CONCENTRATING STRUCTURE WITH PHOTOSENSITIVITY ENHANCING EFFECT

FIELD OF THE INVENTION

This invention applies a light-concentrating structure, particularly a light-concentrating structure with photosensitivity enhancing effect.

BACKGROUND OF THE INVENTION

Image sensors are semiconductors used not only on the home appliances such as smart phones and digital cameras, they are also used in car cameras and monitoring cameras as well. Image sensor is a device that converts optical signals to analog signals. The analog output signal of image sensor is transmitted to the image signal processor making analog/digital (A/D) conversion and color adjustment and then becomes the digital video data. The image sensor converts the light intensity of camera lens into electronic signals. Through the image sensor, the light entering the camera is presented as an image. The image sensor is one of the key components of imaging equipment such as digital cameras and web monitoring cameras. The most commonly used type is the "Charge Coupled Device" (CCD) or the "Complementary Metal-Oxide Semiconductor" (CMOS)

The Charge Coupled Device (CCD) is an integrated circuit, a device based on analog signals. When the optical signal is projected on the surface, it will generate a charge signal, which is converted into a voltage and outputs the picture and image signal according to the specified timing. Other circuits on the motherboard convert the charge signals into digital signals for processing by the processor.

The Complementary Metal-Oxide Semiconductor (CMOS) also is an integrated circuit, the basic devices of P-channel MOSFET (PMOS) and n-type MOSFET (NMOS) can be produced in silicon wafer; since P-channel MOSFET (PMOS) and n-type MOSFET (NMOS) are characteristically complementary, they are called the CMOS.

Today, Complementary Metal-Oxide Semiconductor (CMOS) is also often used as the image sensors of digital imaging equipment, also known as an Active Pixel Sensor. There is a corresponding circuit near each photoelectric sensor to directly convert the light energy into a voltage signal. The difference between the Complementary Metal-Oxide Semiconductor (CMOS) and the Charge Coupled Device (CCD) is that the Complementary Metal-Oxide Semiconductor (CMOS) does not involve charge signals.

Both the Charge Coupled Device (CCD) sensors and the Complementary Metal-Oxide Semiconductor (CMOS) sensors have their own advantages and disadvantages. The image of Charge Coupled Device (CCD) is superior to the image of Complementary Metal-Oxide Semiconductor (CMOS); yet, the Complementary Metal-Oxide Semiconductor (CMOS) has the advantages of low cost, low power consumption, fast transmitting speed and high integration. With the progressing of technology, nowadays the industry has developed a Complementary Metal-Oxide Semiconductor (CMOS) image sensor that can match the image quality of Charge Coupled Device (CCD), making the image sensor gradually transition from traditional Charge Coupled Device (CCD) to the Complementary Metal-Oxide Semiconductor (CMOS).

Complementary Metal-Oxide Semiconductor (CMOS) can be used to make computer static random access memory, controllers, processors and other digital logic circuit systems, for example, Complementary Metal-Oxide Semiconductor (CMOS) devices are very common in some high-level digital cameras, which make Complementary Metal-Oxide Semiconductor (CMOS) synonymous with image sensor.

Complementary Metal-Oxide Semiconductor (CMOS) can be installed in a digital camera. The digital camera is the camera that uses the photosensitive coupling element or the complementary metal oxide semiconductor sensor to replace the chemical photosensitive function of the traditional camera film. Unlike traditional cameras that record images through chemical changes on the film caused by light, the main components of the digital camera include the image sensor, dark room, photosensitive medium and control structure.

Continue to above, the darkroom connects its lens with the photosensitive medium to protect the photosensitive medium and ensure that the photosensitive medium will not be interfered by external light during the imaging process.

Continue to above, the photosensitive medium is responsible for capturing and recording images.

Continue to above, the control structure can control or change the way of capturing and recording the image and the final imaging effect of the image.

Continue to above, the image sensor is usually made of a lens group built by optical glass, called a lens.

The light sensor is a single module that integrates complex procedures and functions of the aforesaid optical sensing element, micro-lens light-concentrating structure, filter, optical reading circuit, and signal processing. Although the structure of modern light sensor can generally satisfy the originally intended purposes, yet, all modern light sensors need to be equipped with the light-concentrating elements, which lead to an increase in the overall thickness of the conventional light sensors. The industry's search for a design in further reducing the thickness of the conventional photoreceptor is still an urgent issue for the industry to work on.

In view of the aforesaid problems of the conventional technologies, this invention provides a light-concentrating structure with photosensitivity enhancing effect, which combines an interconnection structure with a light-concentrating element to further eliminate the light-concentrating element and reduce the thickness of the photoreceptor.

SUMMARY OF THE INVENTION

One purpose of this invention is to provide a light-concentrating structure with photosensitivity enhancing effect; through the interconnection structure, it forms an opening and a light-concentrating recess groove; the interconnection structure combines with the light-concentrating devices and further eliminates the light-concentrating devices to reduce the thickness of image sensor.

To meet the aforesaid purpose and effect, this invention provides a light-concentrating structure with photosensitivity enhancing effect; the interconnection structure is equipped on the substrate and the first electrode layer and is surrounding the dielectric layer, forming an opening and a light-concentrating recess groove; use this structure to eliminate the need of light-concentrating devices and reduce the overall thickness of image sensor.

In an embodiment of this invention, the interconnection structure further includes at least a first conductive layer; the first conductive layer is arranged on the substrate and the first electrode layer and is surrounding the dielectric layer; the first conductive layer is coupled to the dielectric layer.

In an embodiment of this invention, the interconnection structure further includes at least a second conductive layer equipped above the first conductive layer, forming at least a light-concentrating opening.

In an embodiment of this invention, the interconnection structure further includes at least a second conductive layer equipped above the first conductive layer, forming at least an opening.

In an embodiment of this invention, the interconnection structure further includes a first insulating layer, which is equipped on at least a first conductive layer.

In an embodiment of this invention, the interconnection structure further includes a second insulating layer, which is equipped on at least a second conductive layer.

In an embodiment of this invention, the interconnection structure equips a conductive part between at least a first conductive layer and a second conductive layer; the conductive part is coupled to at least a first conductive layer and a second conductive layer.

DETAILED DESCRIPTION OF THE INVENTION

To enable the Review Committee members having deeper realization and understanding on the features and functions of this invention, we hereby put the embodiment and detailed explanation in below:

This invention provides a light-concentrating structure with enhanced photosensitivity. The interconnection structure is equipped on the substrate and the first electrode layer and is arranged surrounding to the dielectric layer, forming an opening to make a light-concentrating recess groove: The use of this structure eliminates the need of concentrating elements and reduces the thickness of the overall light sensor.

Figure 1:
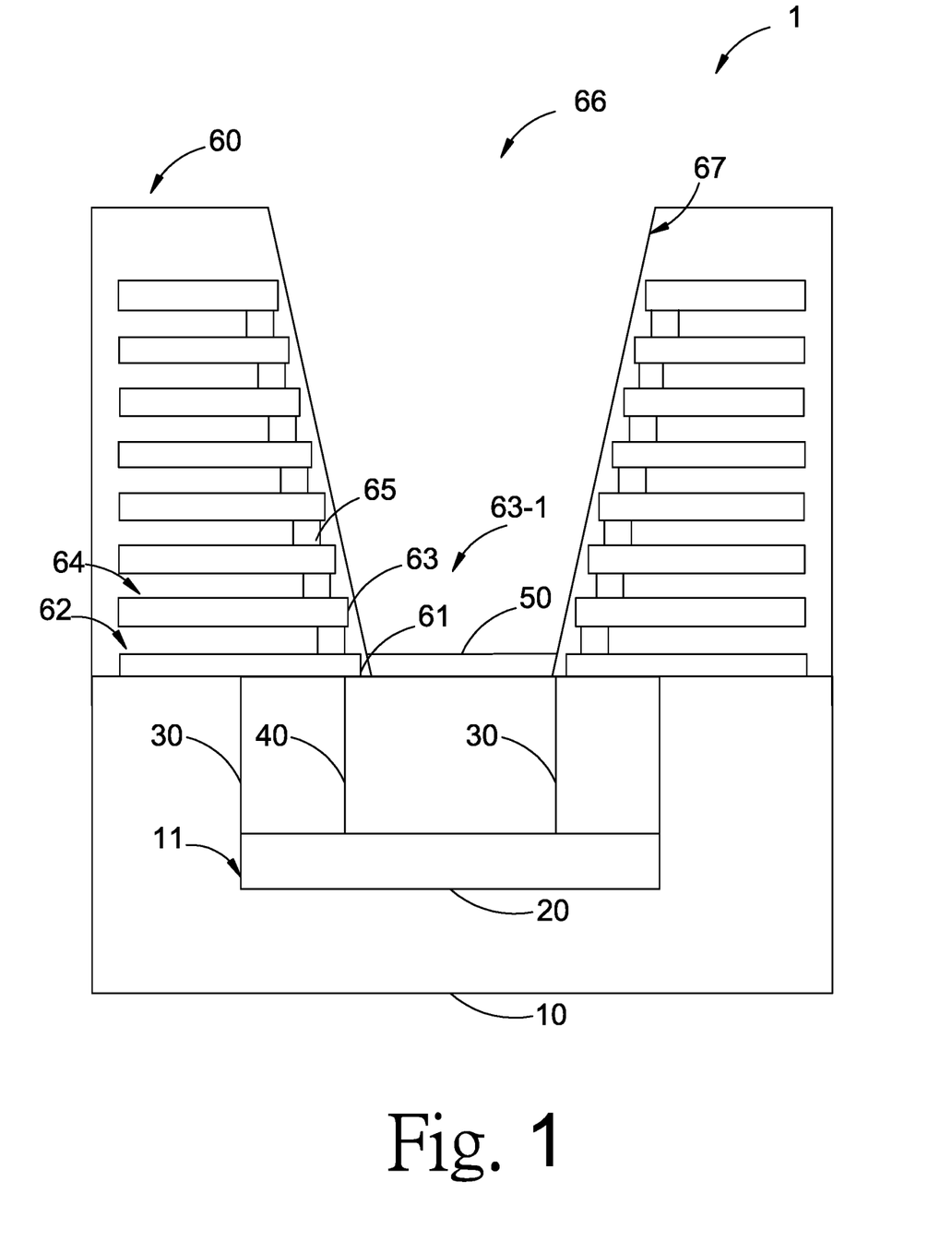
FIG. 1: The schematic diagram of structure in this invention.

Refer to FIG. 1, which is the schematic diagram of structure in the embodiment of this invention. As shown in FIG. 1, this embodiment provides a light-concentrating structure with the function of enhancing the photosensitive effect, including: a Substrate 10, a Buried Layer 20, a First Electrode Layer 30, a Second Electrode Layer 40, a Dielectric Layer 50 and an Interconnection Structure 60.

Refer to FIG. 1 again, as shown in the figure, in this embodiment, the Substrate 10 is equipped with a Housing Space 11; the Buried Layer 20 is arrange above the Substrate 10 and in the Housing Space 11; the First Electrode Layer 30 is arranged surrounding to and on the Buried Layer 20; the Second Electrode Layer 40 is arranged in the middle of the First Electrode Layer 30; the Dielectric Layer 50 is equipped above the Second Electrode Layer 40; the Interconnection Structure 60 is equipped above the Substrate 10 and the First Electrode Layer 30 and is surrounding the Dielectric Layer 50, forming the Opening 66 and the Light-Concentrating Recess Groove 67.

Continue to above, as shown in FIG. 1, in this embodiment, the Interconnection Structure 60 further at least include a First Conductive Layer 61 and a Second Conductive Layer 63; at least one First Conductive Layer 61 is equipped on the Substrate 10 and the First Electrode Layer 30 and is surrounding the Dielectric Layer 50; the First Conductive Layer 61 coupled to the First Electrode Layer 30, the Second Electrode Layer 40 and the Dielectric Layer 50; at least one Second Conductive Layer 63 is arranged above the First Conductive Layer 61 to form at least one Light-Concentrating Opening 63-1.

Continue to above, as shown in the figure, in this embodiment, the Interconnection Structure 60 further includes at least a First Insulating Layer 62 and a Second Insulating Layer 64; at least one First Insulating Layer 62 is equipped on top of at least one First Conductive Layer 61; at least one Second Insulating Layer 64 is equipped on top of at least one Second Conductive Layer 63.

Continue to above, as shown in the figure, in this embodiment, a Conductive Part 65 is equipped between at least a First Conductive Layer 61 and at least a Second Conductive Layer 63, and the Conductive Part 65 is coupled to at least a First Conductive Layer 61 and at least a Second Conductive Layer 63.

Figure 2A:
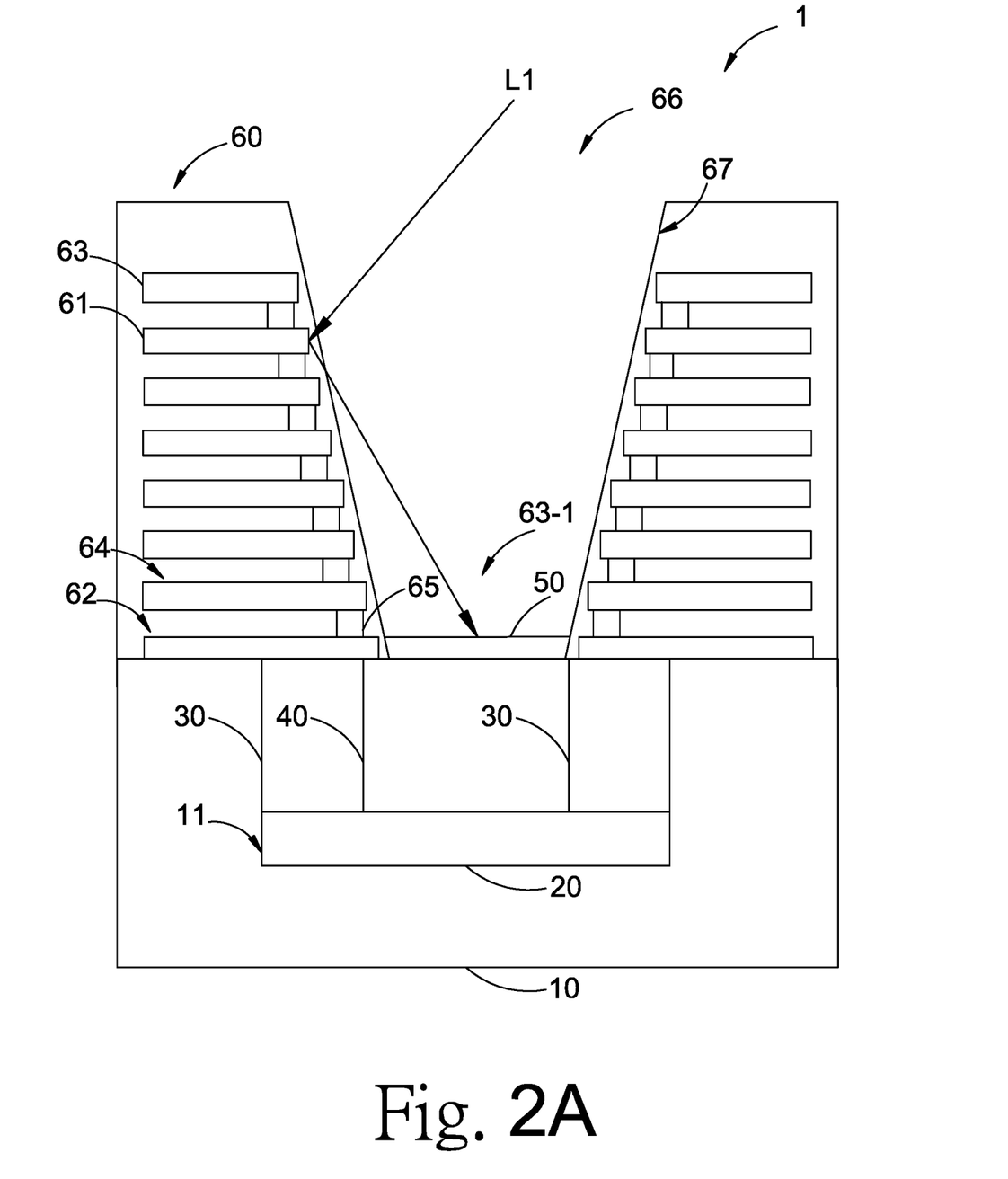
FIG. 2A: The schematic diagram of reflection in an embodiment of this invention.

Refer to FIG. 1 together with FIG. 2A, which is the schematic diagram of light route in the embodiment of this invention. As shown in the diagram, in this embodiment, the Light-concentrating Structure 1 with photosensitivity enhancing effect emits a First Light L1 that shoots the First Conductive Layer 61; the First Conductive Layer 61 reflects the First Light L1 to the Dielectric Layer 50 and shoots it to the First Electrode Layer 30.

Figure 2B:
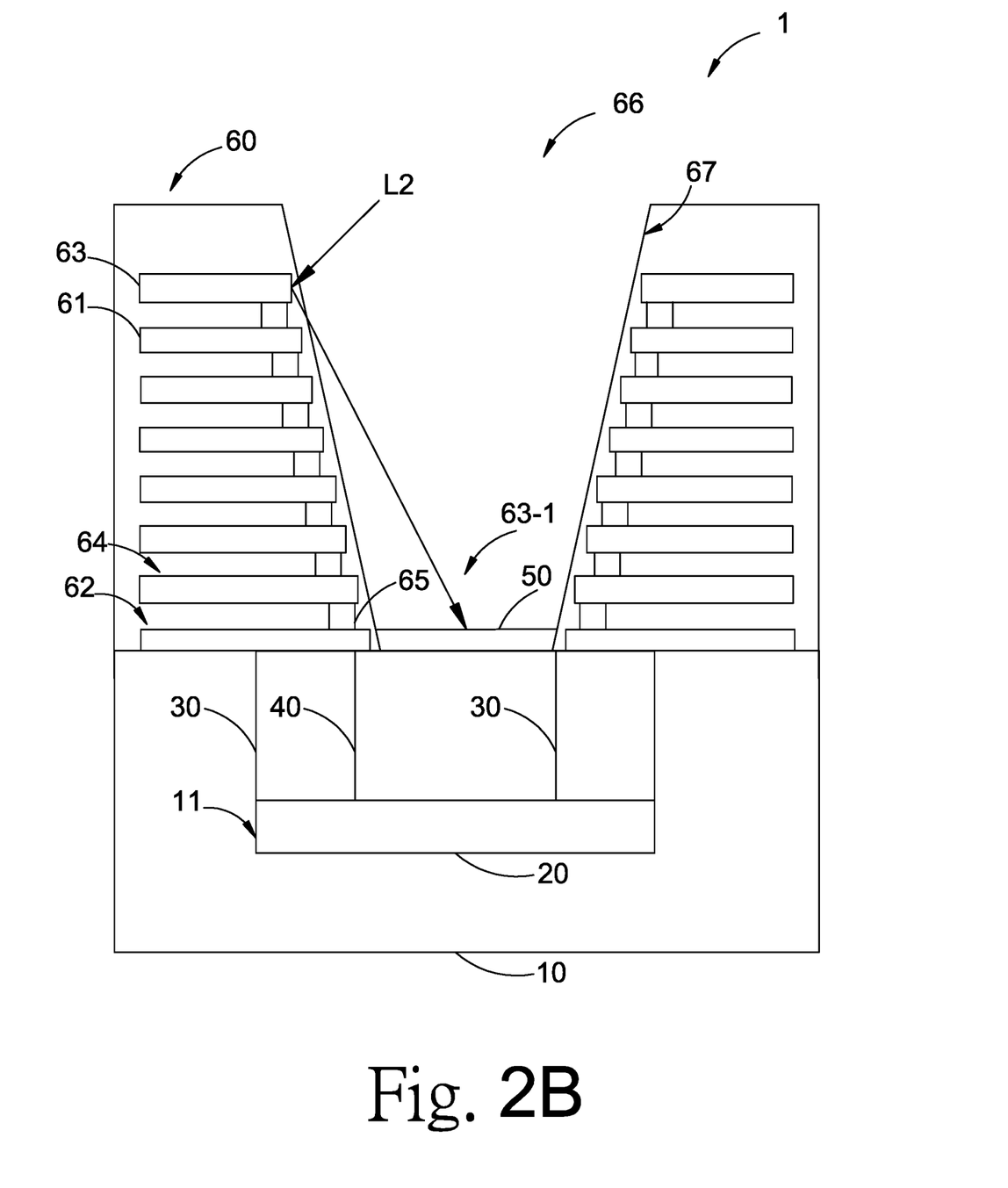
FIG. 2B: The schematic diagram of reflection in an embodiment of this invention.

Refer to FIG. 1 together with FIG. 2B, which is the schematic diagram of light route in the embodiment of this invention. As shown in the diagram, in this embodiment, the Light-concentrating Structure 1 with photosensitivity enhancing effect emits a Second Light L2 that shoots the Second Conductive Layer 63; the Second Conductive Layer 63 reflects the Second Light L2 to the Dielectric Layer 50 and shoots it to the First Electrode Layer 30.

Figure 2C:
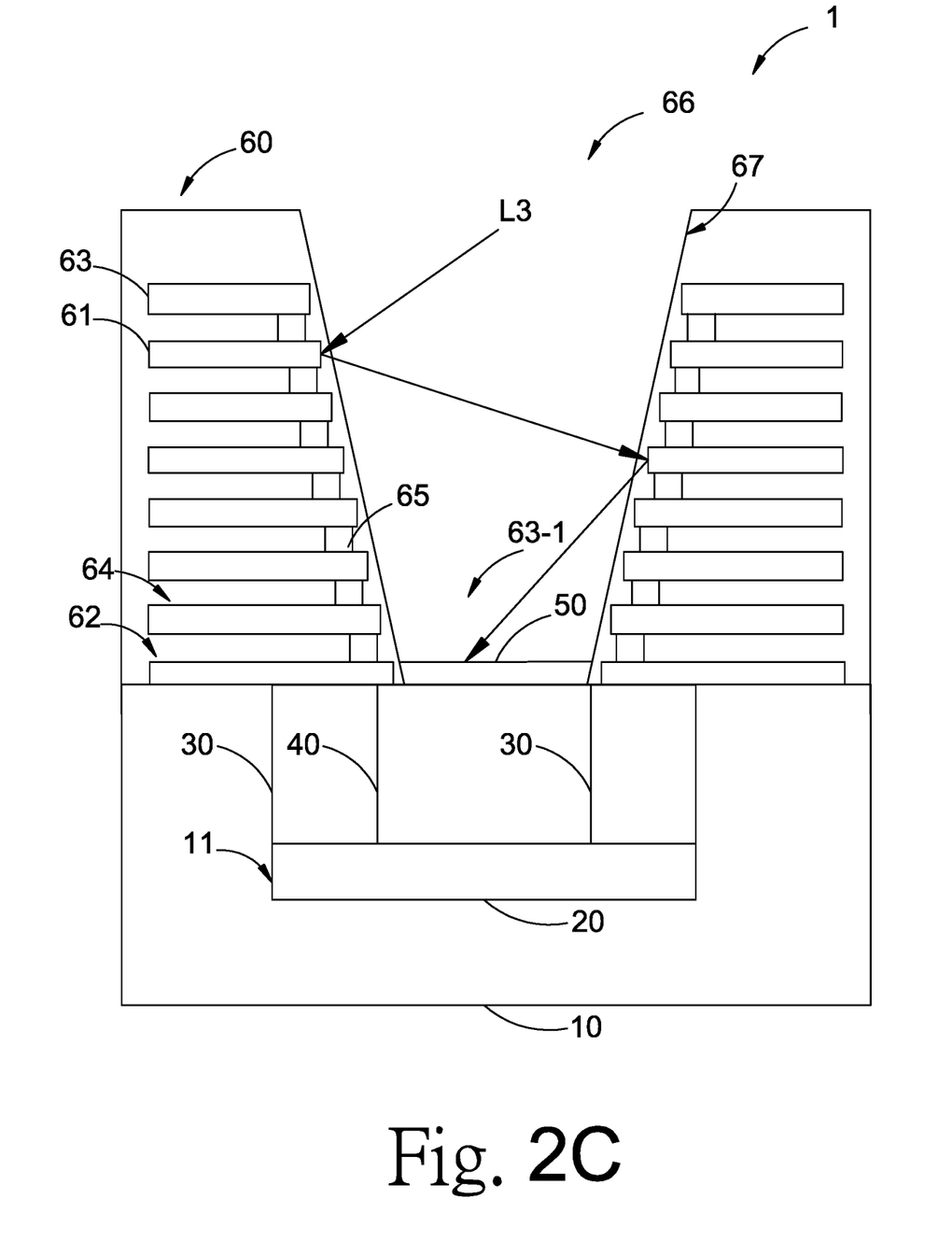
FIG. 2C: The schematic diagram of reflection in an embodiment of this invention.

Refer to FIG. 1 together with FIG. 2C, which is the schematic diagram of light route in the embodiment of this invention. As shown in the diagram, in this embodiment, the Light-concentrating Structure 1 with photosensitivity enhancing effect emits a Third Light L3 that shoots the First Conductive Layer 61; the First Conductive Layer 61 reflects the Third Light L3 to the corresponded First Conductive Layer 61 and the First Conductive Layer 61 reflects the Third Light L3 to the Dielectric Layer 50 and shoots it to the First Electrode Layer 30.

Figure 2D:
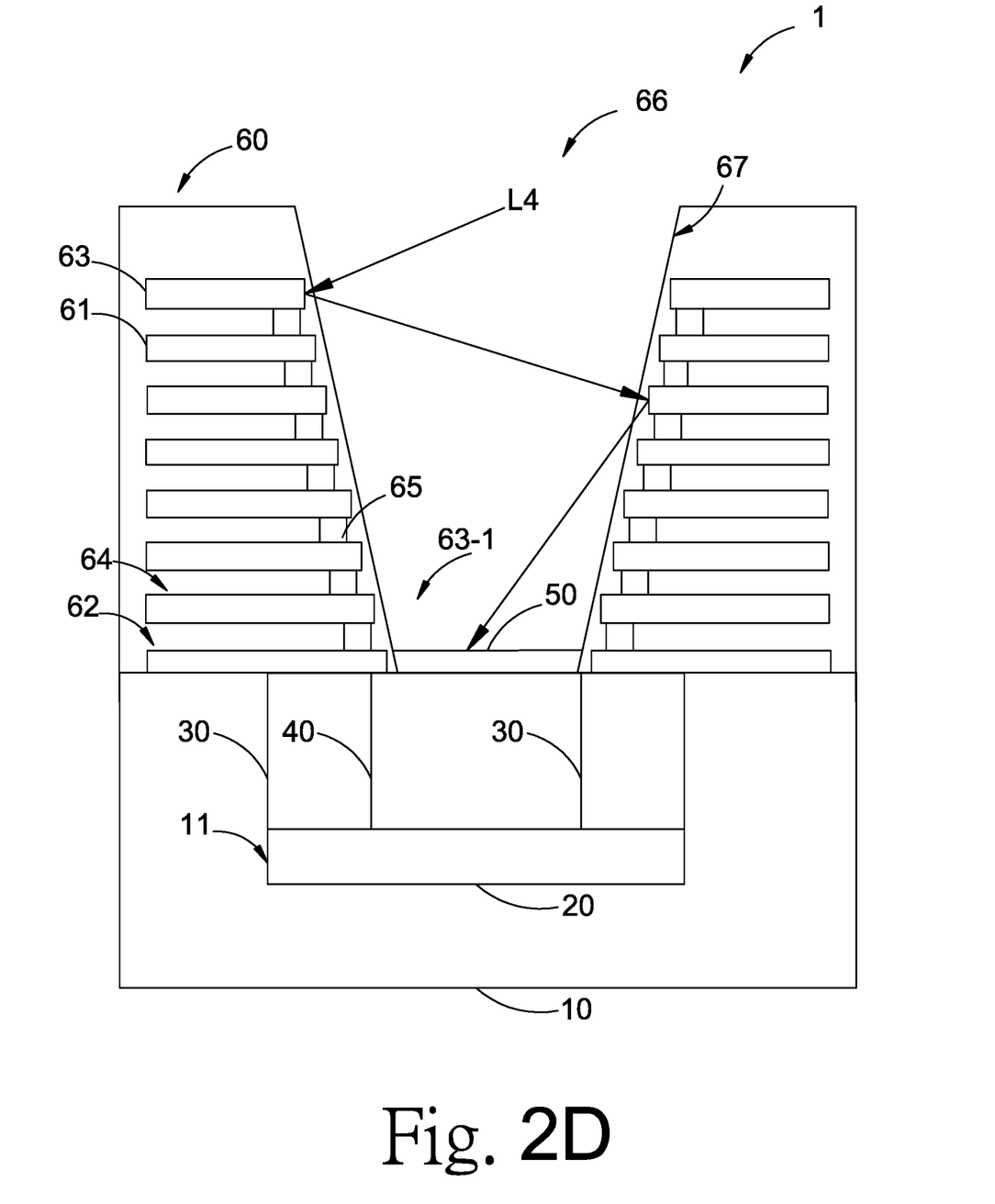
FIG. 2D: The schematic diagram of reflection in an embodiment of this invention.

Refer to FIG. 1 together with FIG. 2D, which is the schematic diagram of light route in the embodiment of this invention. As shown in the diagram, in this embodiment, the Light-concentrating Structure 1 with photosensitivity enhancing effect emits a Fourth Light L4 that shoots the Second Conductive Layer 63; the Second Conductive Layer 63 reflects the Fourth Light L4 to the corresponded Second Conductive Layer 63 and the corresponded Second Conductive Layer 63 reflects the Fourth Light L4 to the Dielectric Layer 50 and shoots it to the First Electrode Layer 30.

Figure 2E:
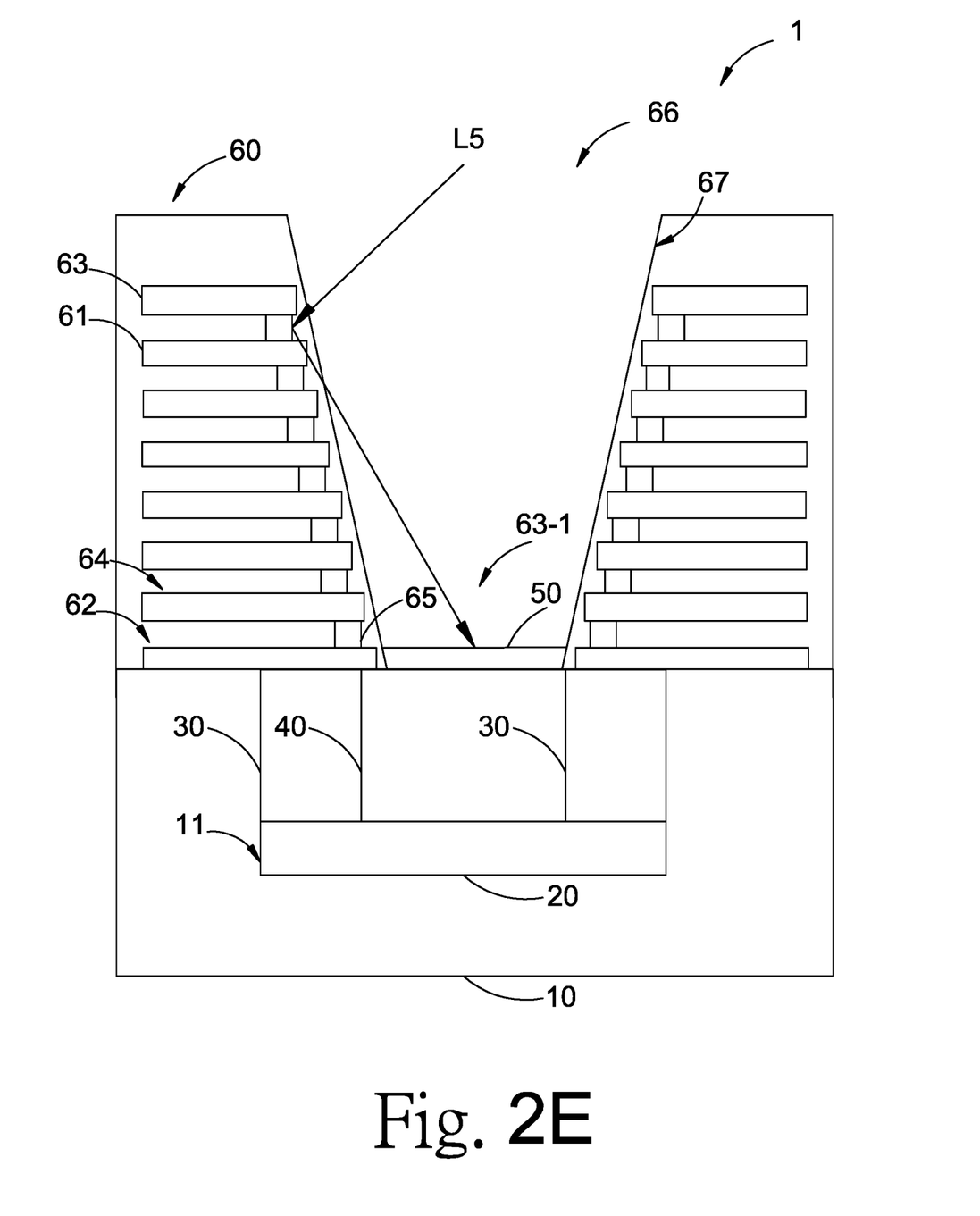
FIG. 2E: The schematic diagram of reflection in an embodiment of this invention.

Refer to FIG. 1 together with FIG. 2E, which is the schematic diagram of light route in the embodiment of this invention. As shown in the diagram, in this embodiment, the Light-concentrating Structure 1 with photosensitivity enhancing effect emits a Fifth Light L5 that shoots the Conductive Part 65; the Conductive Part 65 reflects the Fifth Light L5 to the Dielectric Layer 50 and shoots it to the First Electrode Layer 30.

This embodiment is a light concentrating structure with photosensitivity enhancing effect, including: the Substrate 10, the Buried Layer 20, the First Electrode Layer 30, the Second Electrode Layer 40, the Dielectric Layer 50 and the Interconnection Structure 60; the Buried Layer 20 in this embodiment is a layer of impurities with low resistivity, embedded in the Substrate 10 and underneath the Second Electrode Layer 40; the Buried Layer 20 is used to reduce the serial resistance; light is emitted to the Light-Concentrating Recess Groove 67 in the Interconnection Structure 60; the Light-Concentrating Recess Groove 67 reflects and gathers light to the First Electrode Layer 30 and the Second Electrode Layer 40; the First Electrode Layer 30 is the P-type semiconductor, doping a small amount of boron or indium into the silicon or germanium crystal of the P-type semiconductor. When the silicon crystal is doped with a large number of trivalent atoms, it will cause many electron holes in the covalent bond structure of the material, which is equivalent to a positive charges, so that the P-type semiconductor can become a conductive substance, and the Second Electrode Layer 40 is an N-type semiconductor, which is doped with a small amount of phosphorus or antimony in the silicon or germanium crystal of the N-type semiconductor. When the silicon crystal is doped with a large amount of pentavalent atoms, then, in the covalent bond structure, one of the valence electrons in the pentavalent atom is easier to become a free electron, making the N-type semiconductor become a semiconductor with more free electrons. After the First Electrode Layer 30 and the Second Electrode Layer 40 have received light, light outputs photoelectric current to the First Electrode Layer 30 and the Second Electrode Layer 40; different light intensity will cause different photoelectric current, when larger photoelectric current is created, by using the Interconnection Structure 60, the Light-Concentrating Recess Groove 67 can gather weak and litter light to the Light-Concentrating Recess Groove 67 that let the First Electrode Layer 30 and the Second Electrode Layer 40 accept more light via the Light-Concentrating Recess Groove 67; for example, in this embodiment, it can use the image sensor of a digital camera to make photos at night and upgrades the photo-taking effect.

Continue to above, in this embodiment, the Substrate 10 is used to support the upper Interconnection Structure 60 and the Dielectric Layer 50; the Dielectric Layer 50 can be used as the protecting cover of semiconductor surface; for example, the First Electrode Layer 30, Second Electrode Layer 40 and Interconnection Structure 60 in this embodiment are arranged surrounding the Dielectric Layer 50 to form the Opening 66 and the Light-Concentrating Recess Groove 67. Use this structure to eliminate the need of concentrating elements and reduces the overall thickness of the image sensor.

In summary, this invention provides a light-concentrating structure with enhanced photosensitivity. Through the interconnecting structure, an opening is formed to make a light-concentrating groove, and the interconnection structure is combined with the light-concentrating element. To further eliminate the light-concentrating elements and reduce the thickness of the photoreceptor, solving the problem that the current light sensor needs to be equipped with a concentrating element that leads to an increase in the overall thickness of the conventional light sensor.

Therefore, this invention is innovative, progressive and available for industrial use. It should undoubtedly meet the patent application requirements of ROC Patent Act. We hereby file the patent application in this invention in accordance with the law and anticipate the Authority's patent granting.

However, the foregoing is only an embodiment of this invention; it is not used to restrict the implementing scope of this invention. Therefore, all changes and modifications of shape, structure, characteristics and spirit described in the patent application claims of this invention shall be included in the patent application claims of this invention.

SYMBOLS

1 Light-concentrating structure with photosensitivity enhancing effect
10 Substrate
11 Housing Space
20 Buried Layer
30 First Electrode
40 Second Electrode
50 Dielectric Layer
60 Interconnection Structure
61 First Conductive Layer
62 First Insulating Layer
63 Second Conductive Layer
63-1 Light-concentrating opening
64 Second Insulating Layer
65 Conductive part
66 Opening
67 Light-Concentrating Recess Groove
L1 First Light
L2 Second Light
L3 Third Light
L4 Fourth Light
L5 Fifth Light

What is claimed is:

1. A light-concentrating structure with photosensitivity enhancing effect, including:
   A substrate with a housing space;
   A buried layer equipped above the substrate in the housing space;
   A first electrode layer arranged on the buried layer and is coupled to the buried layer;
   A second electrode layer arranged in the middle of the first electrode layer and above the buried layer;
   A dielectric layer arranges above the second electrode layer; and
   An interconnection structure arranged on the substrate and the first electrode layer, surrounding the dielectric layer to form an opening and make a light-concentrating recess groove;
   wherein the interconnection structure includes:
      at least a first conductive layer;
      at least a second conductive layer; and
      a conductive part, equipped between the least a first conductive layer and the least a second conductive layer; the conductive part, the least a first conductive layer and the least a second conductive layer reflecting and gathering light to the first and second electrode layers.

2. The light-concentrating structure with photosensitivity enhancing effect as stipulated in claim 1, in which the at least one first conductive layer is equipped on the substrate and the first electrode layer with the surrounding dielectric layer.

3. The light-concentrating structure with photosensitivity enhancing effect as stipulated in claim 2, in which the at least one second conductive layer is equipped above the first conductive layer to form at least a light-concentrating opening.

4. The light-concentrating structure with photosensitivity enhancing effect as stipulated in claim 1, in which it further includes:
   A first insulating layer equipped on the at least one first conductive layer.

5. The light-concentrating structure with photosensitivity enhancing effect as stipulated in claim 1, in which it further includes:
   A second insulating layer equipped on the at least one second conductive layer.

6. The light-concentrating structure with photosensitivity enhancing effect as stipulated in claim 1, in which the conductive part is equipped between the at least a first conductive layer and the at least a second conductive layer, and the conductive part is coupled to the at least a first conductive layer and the at least a second conductive layer.

\* \* \* \* \*